United States Patent
Ionkin et al.

(10) Patent No.: US 8,734,687 B2
(45) Date of Patent: May 27, 2014

(54) SCREEN-PRINTABLE QUATERNARY CHALCOGENIDE COMPOSITIONS

(75) Inventors: Alex Sergey Ionkin, Kennett Square, PA (US); Brian M. Fish, Wilmington, DE (US); Ross Getty, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/505,829

(22) PCT Filed: Nov. 23, 2010

(86) PCT No.: PCT/US2010/057745
§ 371 (c)(1),
(2), (4) Date: May 3, 2012

(87) PCT Pub. No.: WO2011/066256
PCT Pub. Date: Jun. 3, 2011

(65) Prior Publication Data
US 2012/0238054 A1    Sep. 20, 2012

(51) Int. Cl.
*H01L 31/18*    (2006.01)
*H01L 31/0328*    (2006.01)
*B82Y 30/00*    (2011.01)
*B05D 3/02*    (2006.01)
*C01B 17/00*    (2006.01)
*C01B 19/00*    (2006.01)

(52) U.S. Cl.
USPC ... 252/519.14; 977/932; 977/896; 252/501.1; 438/95; 257/E31.06

(58) Field of Classification Search
USPC .............. 438/95; 977/932; 257/E31.06; 252/519.14, 501.1
See application file for complete search history.

(56) References Cited

U.S. PATENT DOCUMENTS

| | | | |
|---|---|---|---|
| 6,509,066 B1 * | 1/2003 | Jost | 427/529 |
| 7,179,677 B2 * | 2/2007 | Ramanathan et al. | 438/95 |
| 2006/0043354 A1 | 3/2006 | Pinnow et al. | |
| 2008/0124831 A1 * | 5/2008 | Robinson et al. | 438/84 |
| 2008/0149175 A1 | 6/2008 | Horiuchi et al. | |
| 2009/0205714 A1 | 8/2009 | Kuhnlein et al. | |
| 2009/0233237 A1 * | 9/2009 | Yoshiki et al. | 430/311 |
| 2010/0116326 A1 * | 5/2010 | Gur et al. | 136/252 |
| 2012/0138866 A1 * | 6/2012 | Agrawal et al. | 252/501.1 |

OTHER PUBLICATIONS

Guo, Qijie et al., Synthesis of Cu2ZnSnS4 Nanocrystal Ink and Its Use for Solar Cells, Journal of the American Chemical Society, 2009, pp. 11672-11673, vol. 131.

* cited by examiner

*Primary Examiner* — Colleen Matthews
*Assistant Examiner* — Regan J Rundio

(57) ABSTRACT

The present invention relates to screen-printable quaternary chalcogenide compositions. The present invention also provides a process for creating an essentially pure crystalline layer of the quaternary chalcogenide on a substrate. Such coated substrates contain p-type semiconductors and are useful as the absorber layer in a solar cell.

15 Claims, 2 Drawing Sheets

SCREEN-PRINTABLE QUATERNARY CHALCOGENIDE COMPOSITIONS

FIELD OF THE INVENTION

The present invention relates to screen-printable quaternary chalcogenide compositions. The present invention also provides a process for creating an essentially pure crystalline layer of the quaternary chalcogenide on a substrate. Such coated substrates contain p-type semiconductors and are useful as the absorber layer in a solar cell.

BACKGROUND

Solar cells, also termed photovoltaic or PV cells, convert sunlight into electricity. Traditionally, these electronic devices have been fabricated using silicon (Si) as a light-absorbing, semiconducting material in a relatively expensive production process. To make solar cells more economically viable, solar cell device architectures have recently been developed that use thin-film, light-absorbing semiconductor materials such as copper-indium-gallium-sulfo-di-selenide, also termed CIGS.

Despite the demonstrated potential of CIGS in thin-film solar cells, the toxicity and low abundance of indium and selenium are major impediments to the widespread use and acceptance of CIGS in commercial devices. Attractive alternatives to CIGS include quaternary chalcogenides, particularly copper zinc tin sulfide, $Cu_2ZnSnS_4$ (CZTS). It has a bandgap of about 1.5 eV, well within the solar spectrum, and an absorption coefficient greater than $10^4$ cm$^{-1}$. In addition, the CZTS elements are non-toxic and abundant.

Currently, the development of solar cells based upon CZTS lags significantly behind CIGS-based solar cells. Thin films of CZTS have been prepared via sputtering of Cu, SnS, and ZnS precursors, hybrid sputtering, pulsed laser deposition, spray pyrolysis of halides and thiourea complexes, electrodeposition/thermal sulfurization, E-beam Cu/Zn/Sn/thermal sulfurization, and sol-gel followed by thermal sulfurization. However, these methods so not lend themselves to the precision of screen-printing, and also suffer from a lack of reproducibility of film heights and film homogeneity. Delamination of the CZTS layer has also been observed.

Therefore, there is a need for quaternary chalcogenide compositions which can be screen-printed on a substrate, and subsequently converted to an absorber film for use in a photovoltaic device.

SUMMARY OF THE INVENTION

One aspect of the invention is a composition comprising,
a) 45 to 99% by weight based on total composition of quaternary chalcogenide of general formula:

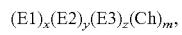

wherein:
1.80<x<2.2, and E1 is selected from Cu, Ag, and Au;
0.90<y<1.10, and E2 is selected from Zn, Cd, and Hg;
0.90<z<1.10, and E3 is selected from Si, Ge, and Sn; and
m=4, and Ch is selected from S, Se, Te, and mixtures thereof;
b) 0.1 to 5% by weight based on total composition of a surfactant selected from the group consisting of long-chain sulfonic, phosphonic and carboxylic acid derivatives;
c) 0.1 to 55% by weight based on total composition of a medium selected from wood rosin, mixtures of ethyl cellulose and phenolic resins, polymethacrylates of lower alcohols, and monobutyl ether of ethylene glycol monoacetate;
d) 0.0 to 5% by weight based on total composition of a crosslinker selected from the group consisting of polyalcohols, polyacids and combinations thereof;
e) 0.1 to 10% by weight based on total composition of a rheological additive selected from the group consisting of esters, alcohols, carbonates, sulfonates and phosphates; and
f) 0.0 to 10% by weight based on total composition of an elemental chalcogen or source of chalcogen.

DETAILED DESCRIPTION

Figure 1A:
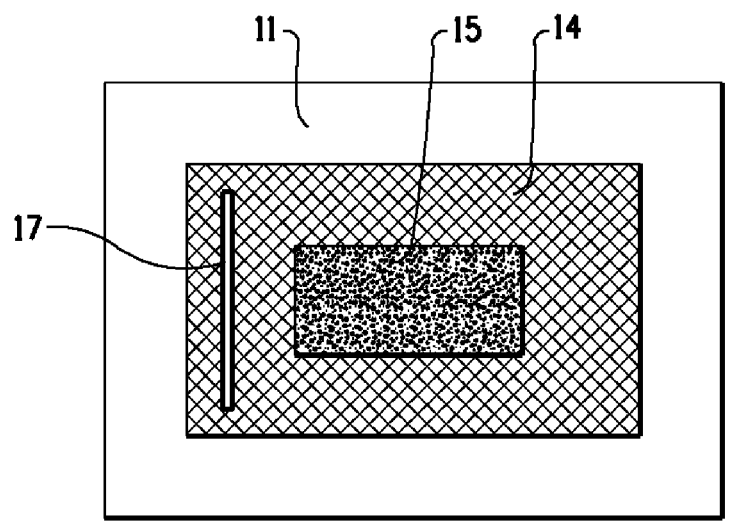
FIG. 1A depicts the deposition of a composition on a substrate according to an embodiment of the present invention.

Herein the terms "solar cell", "photovoltaic cell", and "photovoltaic", are synonymous unless specifically defined otherwise. These terms refer to devices that utilize the specific electronic properties of semiconductors to convert the visible and near visible light energy of the sun into usable electrical energy. The terms "band gap energy", "optical band gap", and "band gap" are synonymous unless specifically defined otherwise. These terms refer to the energy required to generate electron-hole pairs in a semiconductor material, which in general is the minimum energy needed to excite an electron from the valence band to the conduction band. As used herein, the term "chalcogen" refers to Group 16 elements, and the terms "metal chalcogenides" or "chalcogenides" refer to semiconductor materials comprised of metals and Group 16 elements. Metal chalcogenides are important candidate materials for photovoltaic applications, since many of these compounds have optical band gap values well within the terrestrial solar spectra.

The term "CZTS" refers to $Cu_2ZnSnS_4$, "CZTSe" refers to $Cu_2ZnSnSe_4$, "CZTTe" refers to $Cu_2ZnSnTe_4$, CZTS/Se refers to $Cu_2ZnSn(S_a,Se_{1-a})_4$ where 0≤a≤1; and "CZT(S,Se,Te)" encompasses all compounds of formula $Cu_2ZnSn(S_a,Se_b,Te_{1-(a+b)})_4$, where 0≤a≤1 and 0≤b≤1 and (a+b)≤1. CZTS and its analogs may also be doped by small amounts of other elements, such as alkali and alkali earth metals, wherein the dopants are typically derived from the chalcogen source.

The quaternary chalcogenides are of general formula:

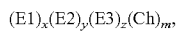

wherein:
1.80<x<2.2, and E1 is selected from Cu, Ag, and Au;
0.90<y<1.10, and E2 is selected from Zn, Cd, and Hg;
0.90<z<1.10, and E3 is selected from Si, Ge, and Sn; and
m=4, and Ch is selected from S, Se, Te, and mixtures thereof.

In one embodiment, E1 is Cu, E2 is Zn, E3 is Sn, and Ch is S or Se.

In an embodiment, the composition contains 45 to 99% by weight based on total composition of the quaternary chalcogenides. The quaternary chalcogenides can be prepared by any method known in the art. One suitable method is heating a source of E1, a source of E2, a source of E3, a source of Ch, and an ionic liquid to a temperature of 100° C. to about 500° C. under an inert atmosphere. The molar ratio of E1:E2:E3: Ch in the reaction mixture is about 2:1:1:4 to about 2:1:1:50. To facilitate the isolation of the quaternary chalcogenide product, the reaction mixture can cooled and the product precipitated by the addition of water or an alcohol. Example 1 illustrates the use of this process to prepare CZTS from salts of copper, zinc and tin with a source of sulfur (tetraethylammonium sulfide) in an ionic liquid (tributylmethylammonium methylsulfate). CZTS can also be prepared by "flux" methodology from binary and secondary sulfides of copper, zinc and tin.

Typically, the quaternary chalcogenide is screened and/or milled to obtain particles of the correct size for use in a screen-printable paste. Suitable milling techniques include ball milling, vibratory milling, Eiger milling, bead milling, jet milling, disc milling, and ultrasonic milling. After milling, the quaternary chalcogenide may comprise crystallites. Suitable crystallites can be characterized by an average longest dimension of about 0.1 to 99 microns. The crystallites of CZTS, CZTSe, CZTS/Se, and CZTS/Se/Te.

Suitable particle sizes of the quaternary chalcogenide are between about 0.1 micron to about 100 microns, or from about 0.1 micron to about 10 microns, or from about 0.1 micron to about 1.5 microns (as measured by D 50%).

To form a screen-printable paste, the quaternary chalcogenide is combined with an organic medium comprising surfactants, cellulosic polymers, rheological additives, and optional cross-linkers. The paste may contain sources of chalcogens and/or elemental chalcogens. In an embodiment, the sources of chalcogens and/or elemental chalcogens is about 0.0 to 10% by weight of the composition. In another embodiment, the elemental chalcogen is elemental sulfur, and is typically about 2.5% by weight of the composition.

The inorganic components of the composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping and storage of the compositions, as well as on the printing screen during the screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives, some of which are described below. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the composition on a substrate.

The optimal amount of organic medium in the composition is dependent on the method of applying the paste and the specific organic medium used. In an embodiment, the composition contains 0.1 to 55% by weight based on total composition of organic medium. Typically, the thick-film paste composition contains 5 to 30 wt % of organic medium.

If the organic medium comprises a polymer, the polymer typically comprises 8 to 15 wt % of the organic composition.

In an embodiment, the composition contains 0.1 to 5% by weight based on total composition of surfactant. Surfactants suitable for use are long-chain sulfonic, phosphonic, or carboxylic acid derivatives. Suitable surfactants include siloxy-, fluoryl-, alkyl- and alkynyl-substituted surfactants, e.g., the commercially available Byk® (Byk Chemie), Zonyl® (DuPont), Triton® (Dow), Surfynol® (Air Products) and Dynol° (Air Products) surfactants. The surfactant is present in amounts of about 0.1 wt % to about 5 wt %, or from about 0.1 wt % to about 2 wt %, or from about 0.1 wt % to about 1 wt %.

In an embodiment the composition comprises 0.0 to 5% wt. based on total composition of a crosslinker. The term "crosslinker" refers to a composition comprising an organic polycarboxylic acid, an organic polyhydroxy compound and combinations thereof. The polyhydroxy compound is also referred to herein as the polyol compound. The term "polycarboxylic acid" refers to an organic acid containing two or more carboxyl (COOH) groups. Suitable polycarboxylic acids include copolymers comprising repeat units derived from styrene and from one or more carboxylic comonomers, wherein the carboxylic comonomers are selected from the group consisting of acrylic acids, methacrylic acids, and combinations thereof. Typically, the polycarboxylic acid copolymer has a molecular weight of 2,000 to 50,000 g/mole, or 3,000 to 6,000 g/mole.

Suitable polyhydroxy compounds include 7,7,11,11-tetrakis[2-(2-hydroxyethoxy)ethoxy]-3,6,9,12,15-pentaoxa-hepta-decane-1,17-diol and N1,N1,N7,N7-tetrakis(2-hydroxyethyl)heptanediamide.

In one embodiment, the crosslinker is selected from the group consisting of polyalcohols, polyacids and combinations thereof.

In an embodiment, the composition contains 0.1 to 10% by weight based on total composition of rheological additives. Rheological additives include thinners such as esters, alcohols, ester alcohols, carbonates, sulfonates, phosphates, and terpenes, such as alpha- or beta-terpineol or mixtures thereof with other solvents such as kerosene, dibutylphthalate, butyl carbitol, butyl carbitol acetate, hexylene glycol and high boiling alcohols and alcohol esters. Non-coloring, non-hydroscopic solvents that promote the dispersion of the quaternary chalcogenides are especially suitable. Thixatrol® (Elementis Specialties) and Foralyns® (Eastman) are suitable rheological additives.

The rheological additives can be used to adjust the viscosity of the composition to between about 180 and about 250 Pa·s to facilitate screen printing.

The quaternary chalcogenide particles can be mixed with the organic medium and other optional components by mechanical mixing to form viscous compositions having suitable consistency and rheology for screen-printing.

In some embodiments, the composition comprises CZTS powder, wherein the CZTS powder is about 45 to about 90 wt %, or about 45 to about 70 wt %, or about 45 to about 60 wt %, or about 45 to about 55 wt %, or about 50 wt % of the total weight of solids. A blend of CZTS powders from more than one source may be used in any of the compositions.

In some embodiments, the composition comprises CZTSe powder, CZT(S,Se) powder, CZTS powder, or mixtures thereof.

This invention also provides a process for depositing the quaternary chalcogenide composition on a substrate.

The compositions of this invention can be applied to substrates by a variety of techniques, including screen-printing with thick film compositions, printing through a stencil mask, doctor blade drawdown, and spraying using mask patterning. In addition, bar-coating can be employed when coating large area substrates. Spin-coating and curtain-coating can be used with lower viscosity formulations. Offset printing and gravure printing, electrophoretic deposition and toning can be employed with a variety of patterning options, but are generally preferred for very thin coatings. The preferred mode for making the coating will depend on multiple factors including the substrate type, the area to be covered, the coating thickness, the pattern resolution and the throughput. The composition of this invention can be printed on rigid or flexible substrate. Suitable substrates include aluminum foil substrates and polymer substrates, either continuous or segmented. Suitable rigid substrate include: glass, solar glass, low-iron glass, green glass, soda-lime glass, metal, steel, stainless steel, aluminum, polymer, ceramic, metal plates, metalized ceramic plates, metalized polymer plates, metalized glass plates, polymer substrates; molybdenum-coated soda lime glass; molybdenum-coated polyimide films, molybdenum-coated polyimide films further coated with a thin layer of a sodium compound, and/or any single or multiple combination of the aforementioned. When the substrate is coated with a sodium compound, the sodium compound can be NaF, $Na_2S$, or $Na_2Se$.

This invention also provides a process for producing an essentially pure crystalline quaternary chalcogenide on a substrate. The process comprises depositing a composition on a substrate, wherein the composition comprises:

a) 45 to 99% by weight of quaternary chalcogenide of general formula:

$$(E1)_x(E2)_y(E3)_z(Ch)_m,$$

wherein:
1.80<x<2.2, and E1 is selected from Cu, Ag, and Au;
0.90<y<1.10, and E2 is selected from Zn, Cd, and Hg;
0.90<z<1.10, and E3 is selected from Si, Ge, and Sn; and
m=4, and Ch is selected from S, Se, Te, and mixtures thereof;
b) 0.1 to 5% by weight of a surfactant selected from the group consisting of long-chain sulfonic, phosphonic and carboxylic acid derivatives;
c) 0.1 to 55% by weight of a medium selected from wood rosin, mixtures of ethyl cellulose and phenolic resins, polymethacrylates of lower alcohols, and monobutyl ether of ethylene glycol monoacetate;
d) 0.0 to 5% by weight of a crosslinker selected from the group consisting of polyalcohols, polyacids and combinations thereof;
e) 0.1 to 10% by weight of a rheological additive selected from the group consisting of esters, alcohols, carbonates, sulfonates and phosphates; and
f) 0.0 to 10% by weight of an elemental chalcogen or source of chalcogen.

The substrate, quaternary chalcogenide, surfactant, medium, crosslinker, rheological additive, and elemental chalcogen or source of chalcogen are as described above.

After deposition, the composition can be dried to form a coated substrate. The thickness of the coating on the coated substrate is typically between 0.1 and 99 microns.

After printing on a substrate, the composition of this invention is typically further processed to form, for example, an absorber for a photovoltaic cell. Typically, this additional processing includes an annealing step, which can form a substantially pure crystalline quaternary chalcogenide. In one embodiment, the quaternary chalcogenide is CZTS, CZTSe, CZTS/Se or CZTS/Se/Te. The annealing temperature is typically between about 50° C. and about 1000° C., or between about 100° C. and about 800° C., or between about 150° C. and about 550° C., or between about 400° C. and about 600° C. Aluminum foil and some high-melting-temperature polymer substrates can be processed at least briefly at 550° C. The processing step can be accelerated via at least one of the following processes: pulsed thermal processing, exposure to laser beams, and/or heating via IR lamps. Other devices suitable for rapid thermal processing can be used, including pulsed lasers used in adiabatic mode, continuous wave lasers (10-30 W), pulsed electron beam devices, scanning electron beam systems and other beam systems, graphite plate heaters, lamp systems, and scanned hydrogen flame systems. The above may be applied singly or in single or multiple combinations with the above or other similar processing techniques. The annealing can be performed in the presence of oxygen.

The annealed film may have increased density and/or reduced thickness versus that of the initially deposited layer, since the organic components and some other materials may have been removed during processing.

CZTS thick film compositions have photovoltaic activity after being fired in air, nitrogen, an inert atmosphere or in a vacuum. In a preferred embodiment, the firing temperature is 500° C.

Figure 1B:
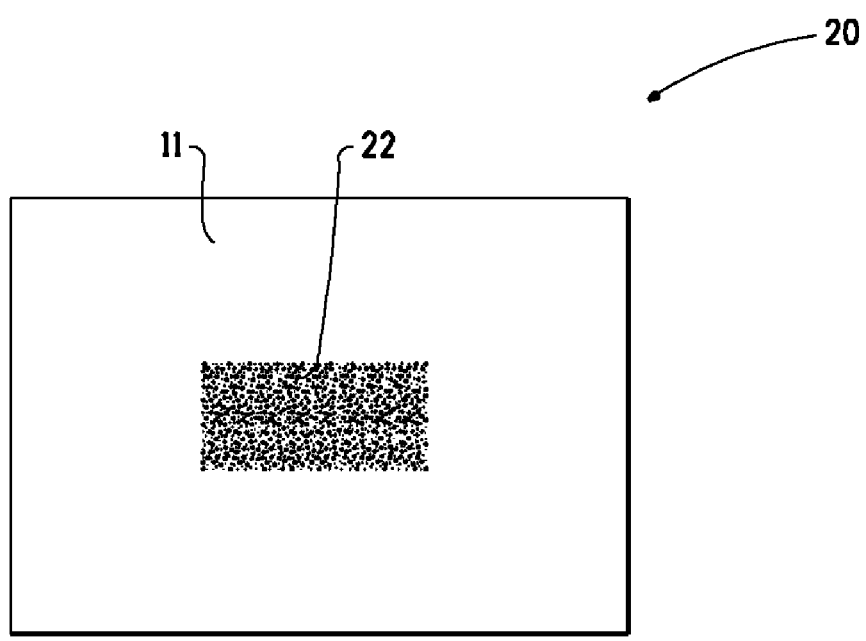
FIG. 1B depicts a substrate with a composition deposited thereon.
Figure 2:
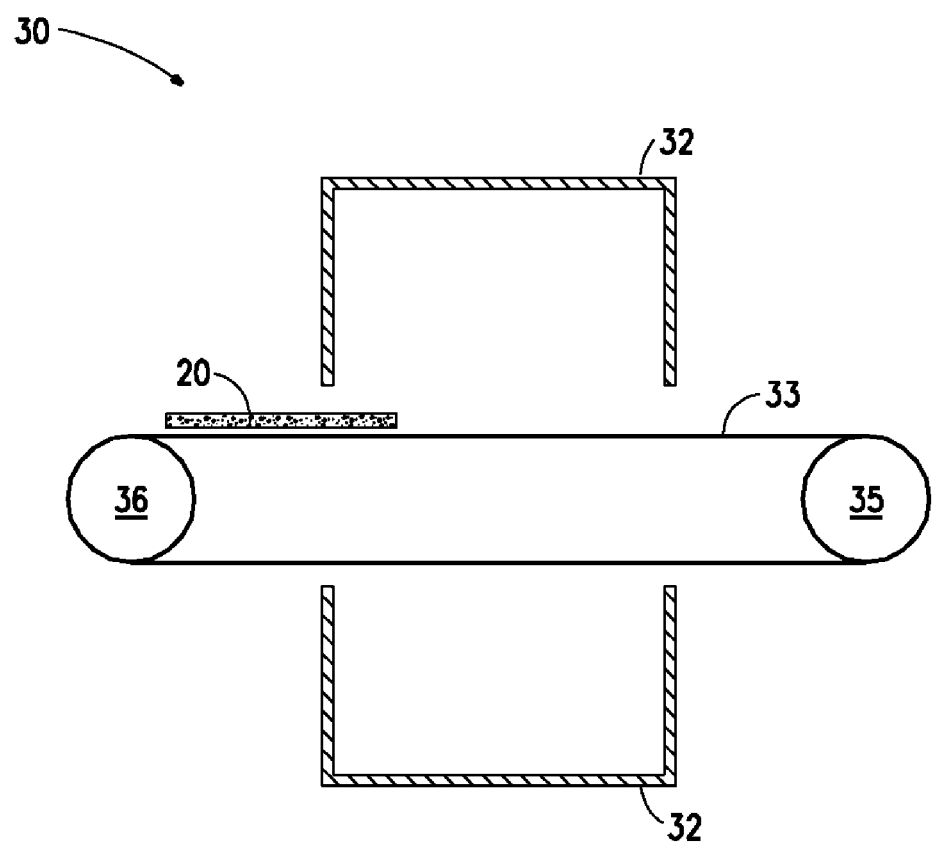
FIG. 2 depicts the drying and heating of a composition on a substrate according on an embodiment of the present invention.

An embodiment of the inventive process is illustrated by drawings. Referring to FIG. 1A, there is depicted a screen printing screen, 14, equipped with a design, 15, in position above a substrate, 11, onto which the prescribed composition is to be deposited. In operation, a squeegee, 17, sweeps across the printing screen to press the composition (not shown) through the design thereby depositing the composition on the substrate. Referring to FIG. 1B, there is depicted a printed substrate, 20, comprising the substrate, 11, and the area where the composition was deposited, 22. Referring to FIG. 2, there is depicted a cut-away of a belt furnace which comprises a furnace, 32, a belt, 33, and rollers, 35 and 36, which tension and drive the belt. In operation, the printed substrate, 20, is placed on the belt and conveyed through the furnace wherein the composition is dried to form a coated substrate and heated to form quaternary chalcogenide.

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

EXAMPLES

General: Copper(II) acetate mono hydrate, copper(II) sulfide, zinc(II) acetate dihydrate, zinc(II) sulfide, Sn(II) chloride, tin(IV) sulfide were purchased from Alfa Aesar (Ward Hill, Mass.). Tetraethylammonium sulfide was purchased from Sigma-Aldrich (St. Louis, Mo.). Tributylmethylammonium methylsulfate, 1,2,4-trimethylpyrazolium methylsulfate, 1,2,3-trimethylpyrazolium methylsulfate, triethanolamine, and butylated hydroxytoluene ionol were purchased from Sigma-Aldrich. Foralyn® is a trademark of Eastman, Inc. (Kingsport, Tenn.), Thixatrol is manufactured by Elementis Specialties (Hightstown, N.J.). Surfactant DBE-3, which is a mixture of dimethyl adipate and dimethyl glutarate, was produced by Invista (Wilmington, Del.). Duomeen was purchased from AkzoNobel (Amsterdam, Holland). Different grades of ethyl cellulose were purchased from Ashland (Covington, Ky.). Merpol A was purchased from Stepan Company (Nothfield, Ill.).

Example 1

Synthesis of CZTS

Tributylmethylammonium methylsulfate (20 g) was heated with stirring at 180° C. under nitrogen. Copper acetate monohydrate (0.9086 g, 4.55 mmol)) was added and dissolved, followed by 0.4995 g (2.27 mmol) of zinc acetate dihydrate, and then 0.5135 g (2.27 mmol) of tin(II) chloride dihydrate.

After dissolution of the metal salts, 2.96 g (18.2 mmol) of tetraethylammonium sulfide was added in one portion. The reaction mixture was kept at 180° C. for 5 hr, during which time the formation of solids was observed. The reaction mixture was cooled and then diluted with 100 ml of methanol. The reaction mixture was filtered and the solid product dried in vacuum, giving a black powder (1.12 g, 56%).

Example 2

Preparation of CZTS Films on a Substrate

Copper (II) sulfide 4.35 g (45.5 mmol), 2.22 g (22.8 mmol) of zinc (II) sulfide and 4.16 g (22.8 mmol) of tin (IV) sulfide were mixed together by shaking for 15 min. The powder mixture was placed into a 20 ml alumina boat, and then into a tube furnace with nitrogen flow at ambient temperature. The boat was heated to 800° C. over 15 min, and then kept at this temperature for 1 day. The sample was cooled to ambient temperature, ground and then placed back into the boat and the tube furnace under nitrogen flow. The heating cycle was then repeated. This procedure was repeated 4 times, giving a total heating time of 5 days.

The sample was analyzed by XRD (x-ray powder diffraction) after each heating cycle. The resulting powder diffraction pattern of the final product showed the presence of CZTS in good purity.

A 6.0 g sample of the CZTS was placed in a plastic bottle (125 ml HDPE) with metal media (stainless steel) and dry roll milled for 3 hrs. The sample was then sifted to isolate the sample from the media. The media were then washed with a small amount of isopropyl alcohol to remove excess CZTS from the media. The combined CZTS was then dried in an oven. The particle distribution showed an average size below 100 micron, with a D(10) of 1.0463 microns, D(50) of 2.1551 microns and D(90) of 5.1602 microns.

To produce the paste, 0.751 g of a first organic medium ("medium 1") was blended with 0.290 g of a second organic medium ("medium 2"). Medium 1 is 11% ethyl cellulose [grade T-200] (Ashland, Covington, Ky.) dispersed in Texanol (Eastman, Kingsport, Tenn.), and medium 2 is 8% ethyl cellulose [grade n-22] (Ashland, Covington, Ky.) dispersed in Texanol (Eastman, Kingsport, Tenn.). Then 0.1153 g of Foralyn 110 by Eastman (Kingsport, Tenn.) was added to the mixture of media 1 and 2. Next 0.1788 g of Duomeen TDO from (AkzoNobel, Amsterdam, Holland), 0.0310 g Thixatrol ST by (Elementis, Hightstown, N.J.), and 0.3096 g of DBE-3 by Invista (Wilmington, Del.) were added to the mixture. The mixture was then mixed using a non-vacuum centrifugal mixer (Thinky USA model ARE-250) for 30 sec. Then 4.5 g of milled CZTS was added in 3 aliquots over 30 sec using a non-vacuum centrifugal mixer. Then 1.3929 g of Texanol (Eastman, Kingsport, Tenn.) was added as a thinner and was mixed on a non-vacuum centrifugal mixer for 1 min to yield a CZTS paste.

The CZTS paste was screen printed on a glass substrate using a printer from Engineered Technical Products (Somerville, N.J.). A sample of the CZTS paste was put on the screen; a small amount was also placed on the squeegee. The squeegee pressed the paste through the design on the screen to apply that design to the part glass substrate. The CZTS film on the substrate was annealed in air using a 10-zone Lindberg belt furnace at a belt speed of 2.0 inches per minute and a peak temperature of 500° C. The time at peak temperature was 20 min. The heating rate was 8.2° C. per minute, and the cooling rate was 5.3° C. per minute. The overall transit time was 72 minutes gate to gate.

No delamination of the CZTS layer from the substrate was observed under these conditions. The film was darker after annealing.

Example 3

CZTS was milled in a jar mill using zirconia milling media for 16 to 24 hr in isopropyl alcohol. The CZTS particle size obtained was D(10) 0.7-0.8 micron, D(50) 1.1-1.4 micron, and D(90) 2.3-3.0 micron.

The CZTS powder was combined with a screen-printable thick film organic medium according to the following formulation:

| Material | Weight % |
| --- | --- |
| Butylated hydroxytoluene ionol | 0.10 |
| Triethanolamine | 0.10 |
| Merpol A | 0.60 |
| Medium 1, as described in Ex. 2 | 15.50 |
| Medium 2, as described in Ex. 2 | 18.00 |
| Texanol | 15.70 |
| CZTS Powder | 50.00 |

Samples were then roll-milled on a three-roll mill for four passes at zero psi, followed by three passes at 100 psi and three passes at 150 psi.

The substrate was a glass substrate (1½"×⅞"×130 mil thick) coated with a thin-film silver or molybdenum electrode. CZTS paste samples were printed through a 325 mesh 0.9 mil diameter stainless steel wire thick film printing screen with a rectangular pattern (1⅛"×⅝"). The screen had a 0.6 mil E-11 emulsion from Sefar America.

The CZTS film was annealed on the glass substrate, as described in Example 2.

A thin-film metal electrode pattern was then patterned over the annealed CZTS layer.

What is claimed is:
1. A composition comprising:
   a) 45 to 99% by weight of quaternary chalcogenide with particle size as measured by D 50% between about 0.1 to about 100 microns and of general formula:

$$(E1)_x(E2)_y(E3)_z(Ch)_m,$$

wherein:
1.80≤x≤2.2, and E1 is selected from Cu, Ag, and Au;
0.90≤y≤1.10, and E2 is selected from Zn, Cd, and Hg;
0.90≤z≤1.10, and E3 is selected from Si, Ge, and Sn; and
m=4, and Ch is selected from S, Se, Te, and mixtures thereof;
b) 0.1 to 5% by weight of a surfactant selected from the group consisting of long-chain sulfonic, phosphonic and carboxylic acid derivatives;
c) 0.1 to 55% by weight of a medium selected from wood rosin, mixtures of ethyl cellulose and phenolic resins, polymethacrylates of lower alcohols, and monobutyl ether of ethylene glycol monoacetate;
d) 0.0 to 5% by weight of a crosslinker selected from the group consisting of polyalcohols, polyacids and combinations thereof;
e) 0.1 to 10% by weight of a rheological additive selected from the group consisting of esters, alcohols, ester alcohols, carbonates, sulfonates, terpenes and phosphates;
f) 0.0 to 10% by weight of an elemental chalcogen or source of chalcogen; and
wherein the viscosity of the composition is between about 180 and about 250 Pa·s.

2. The composition of claim 1, wherein E1 is Cu, E2 is Zn, E3 is Sn, and Ch is S or Se.

3. The composition of claim 1, wherein the quaternary chalcogenide comprises crystallites of CZTS, CZTSe, CZTS/Se or CZTS/Se/Te.

4. The composition of claim 3, wherein the crystallites are characterized by an average longest dimension of about 0.1 to 99 microns.

5. The composition of claim 1, wherein the elemental chalcogen is elemental sulfur.

6. The composition of claim 5, wherein the elemental sulfur is about 2.5% by weight of the composition.

7. A process comprising depositing a composition on a substrate, wherein the composition comprises:
a) 45 to 99% by weight of quaternary chalcogenide with particle size as measured by D 50% between about 0.1 to about 100 microns and of general formula:

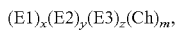

$(E1)_x(E2)_y(E3)_z(Ch)_m,$ wherein:
1.80≤x≤2.2, and E1 is selected from Cu, Ag, and Au;
0.90≤y≤1.10, and E2 is selected from Zn, Cd, and Hg;
0.90≤z≤1.10, and E3 is selected from Si, Ge, and Sn; and
m=4, and Ch is selected from S, Se, Te, and mixtures thereof;
b) 0.1 to 5% by weight of a surfactant selected from the group consisting of long-chain sulfonic, phosphonic and carboxylic acid derivatives;
c) 0.1 to 55% by weight of a medium selected from wood rosin, mixtures of ethyl cellulose and phenolic resins, polymethacrylates of lower alcohols, and monobutyl ether of ethylene glycol monoacetate;
d) 0.0 to 5% by weight of a crosslinker selected from the group consisting of polyalcohols, polyacids and combinations thereof;
e) 0.1 to 10% by weight of a rheological additive selected from the group consisting of esters, alcohols, ester alcohols, carbonates, sulfonates, terpenes and phosphates;
f) 0.0 to 10% by weight of an elemental chalcogen or source of chalcogen; and
wherein the viscosity of the composition is between about 180 and about 250 Pa·s.

8. The process of claim 7, wherein the substrate is selected from the group consisting of glass; metal; polymer substrates; molybdenum-coated soda lime glass; molybdenum-coated polyimide films; and molybdenum-coated polyimide films further coated with a thin layer of a sodium compound.

9. The process of claim 8, wherein the sodium compound is selected from the group consisting of NaF, Na$_2$S, and Na$_2$Se.

10. The process of claim 8, further comprising drying the composition to form a coated substrate comprising a coating on the substrate.

11. The process of claim 10, wherein the thickness of the coating on the coated substrate is between 0.1 and 99 microns.

12. The process of claim 11, further comprising heating the coated substrate to a temperature between 50 and 1000° C. to form a substantially pure crystalline quaternary chalcogenide.

13. The process of claim 12, wherein the quaternary chalcogenide is CZTS, CZTSe, CZTS/Se or CZTS/Se/Te.

14. The process of claim 12, wherein the heating is carried out in the presence of air.

15. The process of claim 12, wherein the temperature is between 400 and 600° C.

\* \* \* \* \*